United States Patent [19]
Sakuda et al.

[11] Patent Number: 5,136,356
[45] Date of Patent: Aug. 4, 1992

[54] SEMICONDUCTOR DEVICE

[75] Inventors: Takashi Sakuda; Kazuhiko Ohkawa; Yasuhiro Oguchi; Yasuhisa Hirabayashi, all of Suwa, Japan

[73] Assignee: Seiko Epson Corporation, Tokyo, Japan

[21] Appl. No.: 510,888

[22] Filed: Apr. 18, 1990

[30] Foreign Application Priority Data

| Apr. 19, 1989 | [JP] | Japan | 1-99130 |
|---|---|---|---|
| May 19, 1989 | [JP] | Japan | 1-125839 |
| Feb. 7, 1990 | [JP] | Japan | 2-27785 |

[51] Int. Cl.⁵ .................. H01L 27/10; H01L 21/82
[52] U.S. Cl. .................... 357/45; 357/41; 437/51; 307/465
[58] Field of Search ........... 357/23.4, 42, 45, 41, 357/23.4; 437/51, 56; 307/445, 448, 451, 465, 465.1

[56] References Cited

U.S. PATENT DOCUMENTS

| 4,500,906 | 2/1985 | Ohno et al. | 357/45 |
|---|---|---|---|
| 4,651,190 | 3/1987 | Suzuki et al. | 357/45 |
| 4,682,201 | 7/1987 | Lipp | 357/45 |
| 4,692,783 | 9/1987 | Monma et al. | 357/45 |
| 4,701,777 | 10/1987 | Takayama et al. | 357/45 |
| 4,701,778 | 10/1987 | Aneha et al. | 357/45 |
| 4,745,084 | 5/1988 | Rowson et al. | 437/51 |
| 4,799,089 | 1/1989 | Fukuma et al. | 357/45 |
| 4,825,273 | 4/1989 | Arakawa | 357/45 |
| 4,853,757 | 8/1989 | Kuramitsu et al. | 357/45 |
| 4,862,241 | 8/1989 | Ashida et al. | 357/45 |
| 4,884,118 | 11/1989 | Hui et al. | 357/45 |
| 4,924,287 | 5/1990 | Orbach | 357/45 |
| 4,949,157 | 8/1990 | Minami | 357/45 |

FOREIGN PATENT DOCUMENTS

| 61-035535 | 2/1961 | Japan. | |
|---|---|---|---|
| 57-100746 | 6/1982 | Japan | 357/45 |
| 58-64047 | 4/1983 | Japan | 357/45 |
| 58-82533 | 5/1983 | Japan | 357/45 |
| 60-80251 | 5/1985 | Japan. | |
| 61-35535 | 2/1986 | Japan. | |
| 62-54450 | 3/1987 | Japan | 357/45 |

OTHER PUBLICATIONS

"Philips PCF700 Series LOCMOS Gate Arrays", *The Proceeedings of the 1st International Conference on Semi-Custom IC's*, 11/81, pp. 65–74.

"Philips PCF700 series LOCMOS gate arrays", The Proceedings of the 1st International Conference on Semi-Custom IC's, Terry Giles, et al., Nov. 1981, pp. 65–74.

*Primary Examiner*—Andrew J. James
*Assistant Examiner*—Viet Q. Nguyen
*Attorney, Agent, or Firm*—Spensley Horn Jubas & Lubitz

[57] ABSTRACT

A semiconductor device assembly composed of a plurality of unit semiconductor devices formed into a logic circuit by selective connection among elements in the unit devices and among the unit devices. Each of the unit devices includes at least a first insulated-gate type field-effect transistor of a first conductivity type and a second insulated-gate type field-effect transistor of a second conductivity type which is disposed adjacent to the first transistor and has a gate electrode separated from a gate electrode of the first transistor. The gate electrodes of the respective transistors have at least a gate terminal portion at the side adjacent to each other, and the gate terminal portion of the first field-effect transistor has at least a first wire connecting location and a second wire connecting location. By using the second wire connecting location, wiring in and among the unit devices can be carried out via the shortest aluminum wires of a first layer, so that the wiring feasibility can be enhanced.

14 Claims, 12 Drawing Sheets

SEMICONDUCTOR DEVICE

BACKGROUND OF THE INVENTION

1. Field of the Invention

The present invention relates to semiconductor devices. More specifically, the present invention pertains to semiconductor devices which comprise closely spaced gate arrays having a plurality of unit semiconductor devices composed of gate-separated type insulated-gate field-effect transistors, the gates of which have an improved configuration.

2. Related Prior Art

Conventional semiconductor chip products of the channelless gate array type have an inner layout as shown in FIG. 15, in which a matrix of a plurality of gate-separated type unit semiconductor devices 2 is disposed on a silicon chip substrate 1 with a plurality of input/output buffer portions B along the peripheral area of the chip substrate so that they surround the matrix of unit devices. FIG. 16 illustrates a portion of the matrix to an enlarged scale. In this type of gate array, insulated-gate field-effect transistors in the same unit device are connected with each other and/or those belonging to different unit devices are connected by means of a first and/or second layers of aluminum wire deposited on the gate array, so that a desired large-scale logic circuitry can be obtained.

FIG. 17 is a circuit diagram of a unit device of the gate-separated type. The unit device 2 is comprised of two pairs of complementary insulated-gate field-effect transistors 2a and 2b of the gate-separated type (hereinafter referred to as "CMOSFET"). The gates G of the CMOSFETs are independent of one another, whereas FETs of the same conductivity type have a common drain D or source S.

FIG. 18 illustrates the physical layout of a conventional structure of the gate-separated unit device 2. As shown, an N-type substrate is provided with a rectangular-shaped P-type well region 3 which is formed by diffusing P-type impurities into the substrate. Polysilicon gates 4N, 5N are formed in the P-type well 3, over a gate oxide film, so that gates 4N, 5N extend across the P-type well and are symmetrical with each other. Adjacent to the P-type well 3 another pair of polysilicon gates 4P and 5P are formed. Gates 4P and 5P are offset from respective gates 4N and 5N in the channel width direction. A high impurity density diffused N-type region 6 is formed in a self-aligned manner by ion implantation of N-type impurities into P-type well 3 with utilization of the pair of polysilicon gates 4N and 5N. Likewise, a high impurity density diffused P-type region 7 is formed in a self-aligned manner by ion implantation of P-type impurities into the N-type substrate with utilization of the pair of polysilicon gates 4P and 5P. In addition, a heavily doped P-type stopper 8 is provided by diffusion adjacent to the region 6 in order to supply voltage $V_{DD}$ to the N-type substrate, and a heavily doped N-type stopper 9 is disposed adjacent to the region 7, the stopper 9 being used for supplying voltage $V_{SS}$ to P well 3.

Each of the polysilicon gates 4N, 5N, 4P and 5P has a U-shaped configuration comprising a long narrow gate electrode portion g and rectangular gate output terminal portions $T_1$ and $T_2$ extended from both ends of gate electrode portion g. Regions just below the respective gate electrode portions g function as channels. A portion of the heavily diffused N-type region 6 between the parallel disposed gate electrode portions g functions as a common drain or source region for the two N-channel MOSFETs. The common drain or source region for the two P-channel MOSFETs is likewise located between the parallel disposed gate electrode portions g in the heavily diffused P-type region 7.

In the gate array of the above-mentioned gate-separated unit device 2, as shown in FIG. 19, laterally adjacent CMOSFETs of the same unit device are wired between their gates oppositely arranged with each other so that the gate output terminal portions $T_1$ and $T_2$ thereof are connected via aluminum wires $l_1$ (shown by solid lines) of a first layer through contact holes (denoted by "X" in the drawing), the first layer being laid on the gates, whereby the shortest wire-connection between adjacent CMOSFETs can be achieved. The diagonal wire connections between terminal portions $T_1$ and $T_2$ in the same unit device can be obtained as shown in FIG. 20, wherein one pair of diagonally positioned terminal portions $T_1$ and $T_2$ are connected by means of the aluminum wire $l_{11}$ of a first layer through contact holes. The other pair of diagonally positioned terminal portions $T_1$ and $T_2$ are connected by means of aluminum wires $l_{12}$ and $l_{13}$ of the first layer and the aluminum wire $l_2$ (shown by double solid lines) of a second layer laid on the first layer, through contact holes and connecting portions denoted by "O". The separated-type unit device has the benefits that it can easily be modified to a common-gate type unit device by wiring as shown in FIG. 19 or that it can be provided with the diagonal wiring as shown in FIG. 20, which is not applicable to the common-gate type unit device. Especially, the applicability of the diagonal wiring is useful to create functional devices such as transmission gates and the like.

However, the diagonal wiring requires a second or more layered aluminum wires if the wire length is intended to be as short as possible. If the second layered aluminum wires $l_2$ are arranged for connection between the elements within the unit devices, the regions occupied by these second layered wires cannot be utilized to arrange other wires for connection between remotely positioned functional unit devices and between functional unit devices and the input/output buffers. Thus, those regions are called "wire prohibited tracks". Therefore, outer wiring feasibility (defined as ease of wiring among the remotely positioned functional unit devices and among the functional unit devices and the input/output buffers) becomes degraded as the number or area of the inner wires of the second or more layers increases.

For example, a D flip-flop shown in FIG. 21 can be constituted by two unit devices 2. In this case, "wire prohibited tracks" occur on the second layer of aluminum, as shown in FIG. 22, due to the diagonal wiring among the inner elements, so that the outer wiring feasibility becomes degraded.

It is of course possible that the two unit devices can be connected without using second layered aluminum wires. However, in this case, the respective aluminum wires of the first layer must be arranged so that they do not cross one another, which means that the total wire length becomes longer, so that the occupied regions for those long wires becomes larger. This degrades inner wiring feasibility (defined as ease of wiring among the elements in each of the unit devices and between adjacent unit devices). If the first layered wires become complicated and elongated, wire resistance and wire capacitance caused by the increased wired area will increase, and so wire time constant will become larger. This will cause a noticeable amount of delay in the device operation.

SUMMARY OF THE INVENTION

Accordingly, it is an object of the present invention to provide a unit semiconductor device of the gate-separated type composed of gates designed to have an improved profile, whereby adjacent gates in the unit device can be diagonally connected by using first layered wires only without increase of the wire length.

It is another object of the present invention to provide a semiconductor device which comprises a gate array of a plurality of unit semiconductor devices having gates of an improved profile to thereby enhance the inner wiring feasibility thereof as well as the outer wiring feasibility.

In order to achieve the above and other objects, according to the present invention, there is provided a semiconductor device having a plurality of unit semiconductor devices arranged in a semiconductor substrate, the unit semiconductor devices being designed to permit connection selectively among the elements in the same unit device and among the unit devices to compose a desired logic circuitry, the unit semiconductor devices comprising at least a first insulated-gate type field-effect transistor of a first conductivity type and a second insulated-gate type field-effect transistor of a second conductivity type, and the respective gate electrodes of both types of transistors being formed with a gate terminal portion at the end facing the other gate electrode, characterized in that the first insulated-gate type field-effect transistor has a gate electrode comprising a gate electrode portion and a gate electrode terminal portion, the profile of the gate electrode terminal portion being such that it has at least a first wire connecting location and a second wire connecting location.

The respective gate electrodes are usually made of polysilicon in consideration of self-aligned formation of their source or drain regions. The remaining region of the semiconductor substrate, which does not contribute substantially to the formation of a channel inverted layer, is utilized as the site on which gate terminal portions of the gate electrodes are disposed. The gate terminal portions can be a layer deposited on the layer of the gate electrodes, which, however, requires another process in addition to the gate electrode forming process. Hence, it is recommendable to form the gate terminal portions in the same layer as the gate electrodes at the same time the gate electrodes are formed.

Typical semiconductor devices of master slice layout are provided with gate electrodes designed to have a profile of short channel length and wide channel width in order to decrease the on-resistance value. On the other hand, an automatic wiring process is usually utilized to connect among the elements in the unit devices and among the unit devices, wherein wires are arranged along the longitudinal and lateral directions of grids, and therefore the first and second insulated-gate field-effect transistors should be arranged such that the channel regions (the gate electrodes) of the respective transistors are oriented in the same direction, either the longitudinal direction or the lateral direction of the grids. The channel regions of the respective transistors may be arranged between the same longitudinal or the same lateral lines of the grids, or they may be in adjacent, parallel grid lines, respectively.

As mentioned above, the gate terminal portions are formed on regions other than those for source or drain, and the gate electrodes are usually of a narrow width shape. The gate terminal portions formed at both ends of a gate electrode are wide in the channel length direction compared to the gate electrode. In this case, the gate terminal portions are generally designed to have a minimum area of one grid square.

In a preferred embodiment of the present invention, the first insulated-gate type field-effect transistor is formed with gate terminal portions of a crank shape, wherein each of the gate terminal portions has a first wire connecting location positioned adjacent to the gate electrode and a second wire connecting location extending from the first wire connecting location in a manner to form the crank shape. In addition, the crank-shaped terminal portion has a connecting location between the first and the second wire connecting locations, and the third location may be another wire connecting location as required.

In another preferred embodiment of the present invention, the gate terminal portions of the first insulated-gate type field-effect transistor are formed to have a rectangular shape, wherein a first wire connecting location is positioned adjacent to an end of the gate electrode and a second wire connecting location is formed extending from the outer edge of the first location. The gate terminal portion of this shape occupies at least an area of two grid squares. In this type of gate terminal position, the first wire connecting location is used for connection with wires arranged along longitudinal and lateral grid lines, respectively. The second wire connecting location is also used for connection with longitudinal and lateral wires, either one of which is the same one as either one of the wires capable of being connected with the first wire connecting location, while in the case of the above-mentioned crank-shaped terminal portion, wires connectable with the first wire connecting locations are different from those which are able to be connected with the second wire connecting locations.

It is apparent that inner and outer wiring feasibilities are improved as the number of wires which can be connected with the gate terminal portions increases. The increase in the number of wires, however, means that the gate terminal portions have an increased area, which causes degradation in element-integrity of semiconductor devices.

In automatic wiring of the gate terminal portions, wires are arranged along the longitudinal and lateral grid lines. Therefore, the gate terminal portions are preferably designed such that they are able to be connected with wires of different grid lines. Thus, in a preferred embodiment of the present invention, there is provided a semiconductor device wherein gate electrodes of unit semiconductor devices are formed at one end with a gate terminal portion of rectangular shape, characterized in that wire junction areas, or portions, are provided in the regions surrounded by four gate terminal portions, each of the wire junction portions having an area of at least three grid squares. The wire junction portions are preferably formed in the same layer as the gate electrodes of polysilicon or the like.

According to the present invention, each of the gate terminal portions comprises the second wire connecting location as well as the first wire connecting location.

The second connecting locations can be, for example, used to connect wires of the first layer through contact holes, by which wire length can be reduced in comparison with using only the first connecting locations for wiring. Hence, the unit devices can be diagonally connected as described before, using wires of only the first layer in such a manner that the wire length is not increased. By this short wiring, the delay time caused by the wiring is reduced, and the inner wiring feasibility is improved. In addition, since the second connecting locations can be utilized for passage of wires of the first layer, fewer wires of the second layer are required, and wire prohibited tracks are reduced in number, whereby the outer wiring feasibility can be enhanced.

Where the gate terminal portions are of a crank shape, the diagonal wiring among the gate terminal portions can be achieved by using only wires of the first layer arranged within the areas on the adjacent gate terminal portions.

While, where the gate terminal portions are of rectangular shape and the wire junction portions are provided, the diagonal wiring among the gates is carried out by connecting wires of the first layer to both ends of the wire junction portions via contact holes, while other wires of the first layer can be arranged to pass over the middle of the wire junction portions. According to the arrangement, wires of the first layer which are required for the diagonal wiring do not project over the source or drain regions. In addition, where the adjacent gate terminal portions are connected, it is possible to make a space between the wires connecting gate terminal portions. The space can be utilized to arrange other wires of the first layer.

DESCRIPTION OF THE DRAWINGS

The above and other objects and advantages of the present invention will be apparent from the following detailed description with reference to the attached drawings, in which.

DESCRIPTION OF THE PREFERRED EMBODIMENTS

While the present invention will be described in connection with several preferred embodiments, it will be understood that it is not intended to limit the invention to these embodiments. On the contrary, it is intended to cover all alternatives, modifications, and equivalents as may be included within the spirit and scope of the invention as defined by the attached claims.

FIGS. 1 through 4 illustrate a first embodiment of the present invention. As shown in FIGS. 1 through 4, a plurality of unit semiconductor devices 12 of gate-separated type are arranged along longitudinal and lateral directions at uniform intervals to form a matrix of the unit devices. Each of the unit devices 12 has a planar structure comprising a pair of N-channel MOSFETs ($F_{N1}$, $F_{N2}$) arranged parallel to each other and a pair of P-channel MOSFETS ($F_{P1}$, $F_{P2}$) arranged parallel to each other and positioned adjacent to the respective N-channel MOSFETs.

Figure 3A:
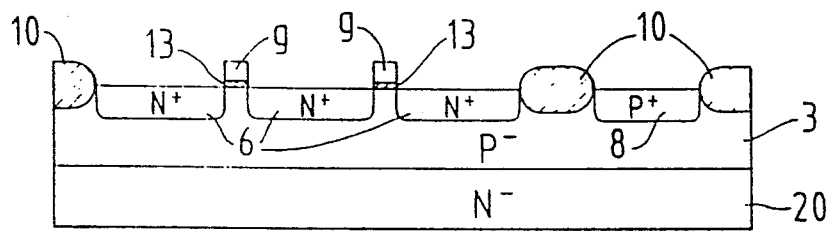
FIG. 3A is a cross-sectional view of the unit device taken along line A—A in FIG. 2.
Figure 3B:
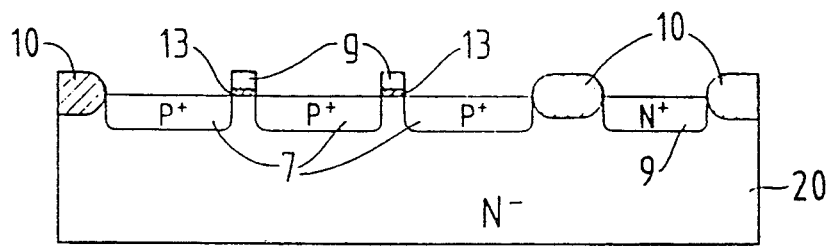
FIG. 3B is a cross-sectional view of the unit device taken along line B—B in FIG. 2.

The region in which the N-channel MOSFETs are formed is provided with a square of P well island 3 by diffusing P-type impurities into an N-type silicon substrate 20 having a low impurity concentration. Referring to FIG. 3A, a patterned silicon oxide gate insulating film 13 is formed on well 3 and a pair of polysilicon gates 14N and 15N are formed in parallel with each other on oxide film 13. High impurity density N-type diffused islands 6 are formed in a self-aligned manner by ion implantation of N-type impurities, utilizing the polysilicon gates 14N and 15N as masks, islands 6 being source and drain regions. Adjacent to islands 6, a high impurity density P-type stopper 8 is formed by diffusion and is used for supplying voltage $V_{SS}$ to P well 3. In addition, thick oxide films 10 are deposited partially on the P-type well 3. Likewise, referring to FIG. 3B, the region in which the P-channel MOSFETs ($F_{P1}$, $F_{P2}$) are formed is provided with a pair of polysilicon gates 14P and 15P which are formed in parallel with each other on the substrate adjacent to P well 3 atop patterned gate insulating film 13. High impurity density P-type diffused islands 7 are formed in a self-aligned manner by ion implantation of P-type impurities, utilizing polysilicon gates 14P and 15P as masks, islands 7 being source and drain regions. Adjacent to the high impurity density islands 7, a high impurity density P-type stopper 9 is formed by diffusion and is used for supplying voltage $V_{DD}$ to the N-type substrate 20. In addition, thick oxide films 10 are deposited partially on substrate 20.

Figure 1:
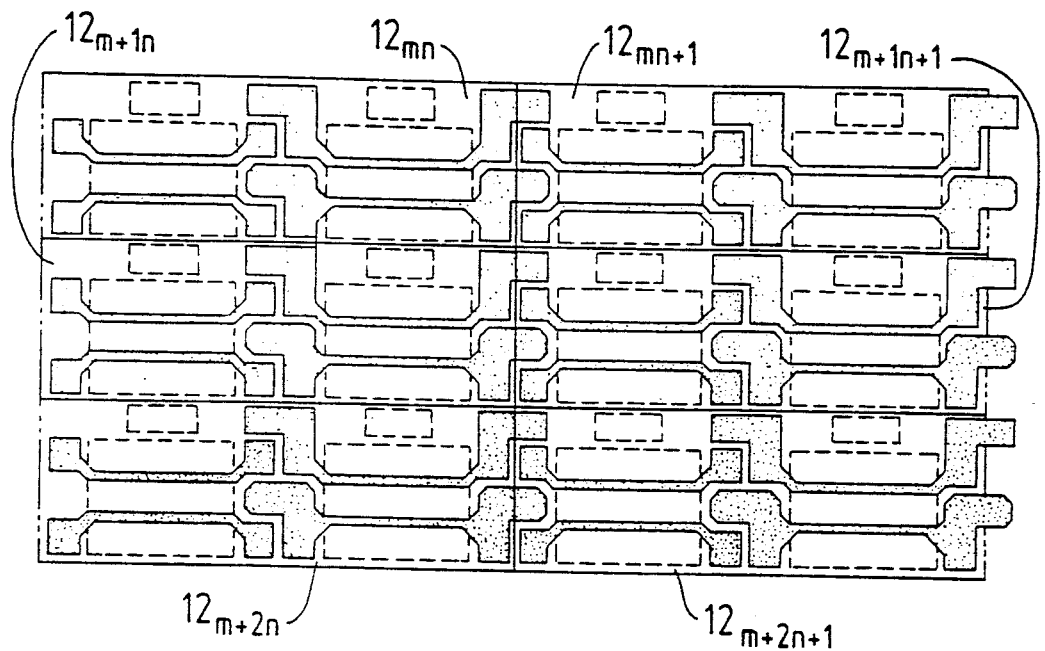
FIG. 1 is a diagram illustrating an array of gate-separated type unit devices according to a first embodiment of the present invention.
Figure 2:
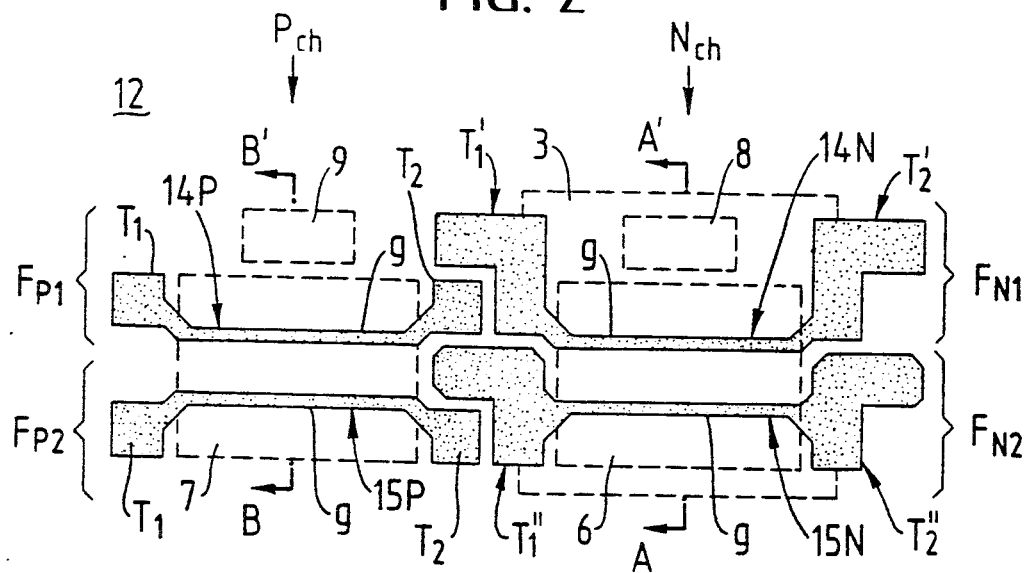
FIG. 2 is a plan view of a unit device in an enlarged scale of FIG. 1.
Figure 4:
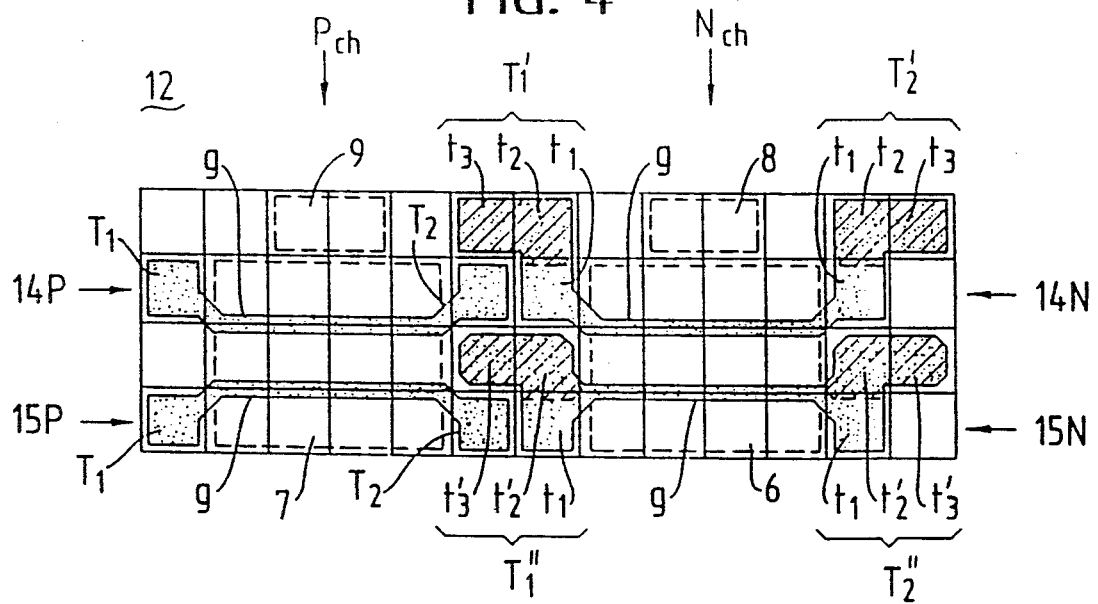
FIG. 4 is a layout of the gate-separated type unit device of FIG. 2.

As shown in FIGS. 2 and 4, polysilicon gates 14P and 15P are shaped to have a substantially flat U-shape and are arranged in mirror symmetry to one another. As shown in FIG. 4, each of polysilicon gates 14P and 15P comprises a long, narrow gate electrode g having a length equal to four grid squares and gate terminal portions $T_1$ and $T_2$ which are integrally connected to respective ends of gate electrode g, are of rectangular shape, and each have an area of one grid square. The gate terminal portions $T_1$ and $T_2$ each have an area sufficient for a single wire connection, that is, for wiring via a single contact hole to form an ohmic contact. The regions just below the gate electrodes g, g, which are spaced apart by the length of one grid square, are for channel regions of four grid square width. Among those, the high impurity density N-type diffused island 7 in the region between the gate electrodes g, g is utilized as a common source or drain region for the two P-channel MOSFETs. Each drain and/or source region 7 for the P-channel MOSFETs has four wire connecting positions arranged in the channel width direction, and the stopper 9 has two wire connecting positions arranged in the same direction, which is the horizontal direction in FIG. 4.

The polysilicon gates 14N and 15N are formed at positions which are offset laterally from the polysilicon gates 14P and 15P by a predetermined distance. The terminal portions of gates 14N and 15N have a different shape from those of gates 14P and 15P, that is, the gate 14N has a portion of the same shape as of the gate 14P and a portion integrally added to the former. In other words, the gate 14N comprises a narrow gate electrode portion g of about four grid square length and crank-shaped gate terminal portions $T_1'$ and $T_2'$ integrally connected to respective ends of the gate electrode portion g.

The terminal portion $T_1^{40}$ adjacent to the gate 14P comprises a first wire connecting location $t_1$ of one grid square area corresponding to the terminal portion $T_1$ of the gate 14P, a second wire connecting location $t_2$ of one grid square area extending from the first terminal location $t_1$ in the channel length direction and a third wire connecting location $t_3$ of one grid square area which is extended from the location $t_2$ in the channel width direction towards the gate 14P and located adjacent to the terminal portion $T_1$ of the gate 14P.

The terminal portion $T_2'$ opposite to the terminal portion $T_1'$ comprises a first wire connecting location $t_1$ of one grid square area corresponding to the terminal portion $T_2$ of the gate 14P, a second wire connecting location $t_2$ of one grid square area extending from the first terminal location $t_1$ in the channel length direction and a third wire connecting location $t_3$ of one grid square area which is extended outwardly from the location $t_2$ in the channel width direction. The second and third wire connecting locations $t_2$ and $t_3$ are located on the same grid row on which the stoppers 8 and 9 are located. The gate 14N itself is shaped symmetrically with respect to a line passing through the center thereof in the channel width direction.

The gate 15N is provided with a terminal portion $T_1''$ adjacent to the gate 15P, the terminal portion $T_1''$ comprising the first wire connecting location $t_1$ of one grid square area corresponding to the terminal portion $T_1$ of the gate 15P, a second wire connecting location $t_2'$ of one grid square area extending from the first terminal location $t_1$ in the channel length direction and a third wire connecting location $t_3'$ of one grid square area which is extended from the location $t_2'$ in the channel width direction toward the gate 14P and located between the terminal portions $T_2$ of the respective gates 14P and 15P. The terminal portion $T_2''$ opposite to the terminal portion $T_1''$ comprises a first wire connecting location $t_1$ of one grid square area corresponding to the terminal portion $T_2$ of the gate 15P, a second wire connecting location $t_2'$ of one grid square area extending from the first terminal location $t_1$ in the channel length direction and a third wire connecting location $t_3'$ of one grid square area which is extended outwardly from the location $t_2'$ in the channel width direction. The second and third wire connecting locations $t_2'$ and $t_3'$, shown by hatching in FIG. 4, are located on the grid row between the parallel gates g, g. The gate 15N itself is shaped symmetrically with respect to a line passing through the center thereof in the channel width direction. In addition, the wire connecting locations $t_2'$ and $t_3'$ of the gate 15N are formed to have chamfered corners relative to the wire connecting locations $t_2$ and $t_3$.

Figure 5:
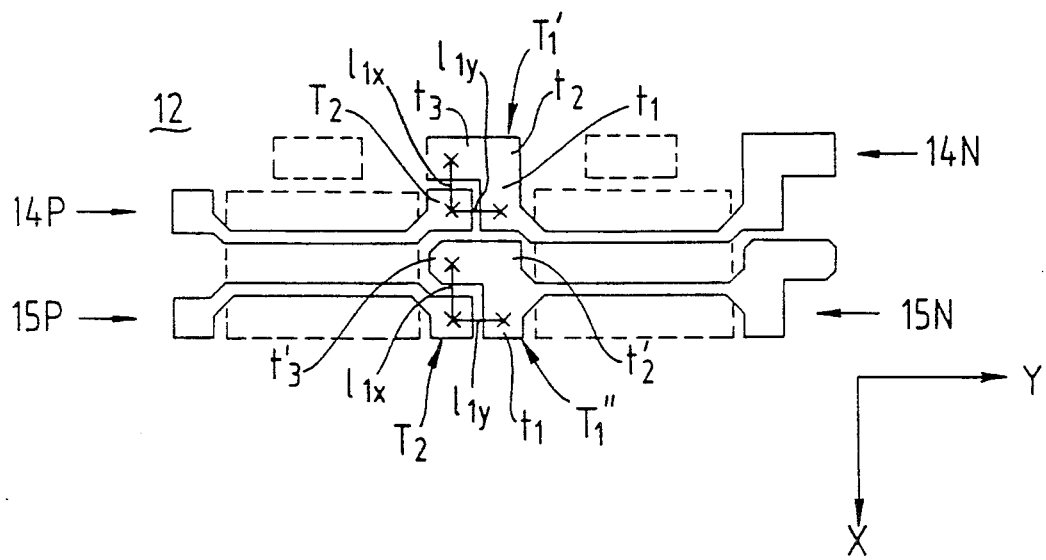
FIG. 5 illustrates one mode of wiring between gates positioned adjacent to each other in the lateral direction in the gate-separated type unit device in FIG. 2.

The terminal portions $T_2$ of gates 14P and 15P can be connected to the terminal portions $T_1'$ and $T_1''$ in two wiring patterns as shown in FIG. 5. A first wiring pattern is such that each terminal portion $T_2$ is connected via contact holes (shown by 'X') with a respective terminal portion $T_1'$ or $T_1''$ by means of an aluminum wire $l_{1Y}$ of the first layer arranged along the Y grid direction. The other wiring pattern is such that each terminal portion $T_2$ is connected via contact holes (shown by 'X') with a respective terminal portion $T_1''$ or $T_1''$ at their third connecting locations $t_3$ by means of an aluminum wire $l_{1X}$ of the first layer arranged in the X grid direction normal to the Y grid direction. Thus, where a pair of adjacent gate-separated type CMOSFETs in the same unit device are connected with each other to form a common gate, two possibilities for the shortest wiring are available, utilizing only the wires of the first layer having one grid length. This means that the wiring feasibility is extremely enhanced compared to the conventional devices.

Figure 18:
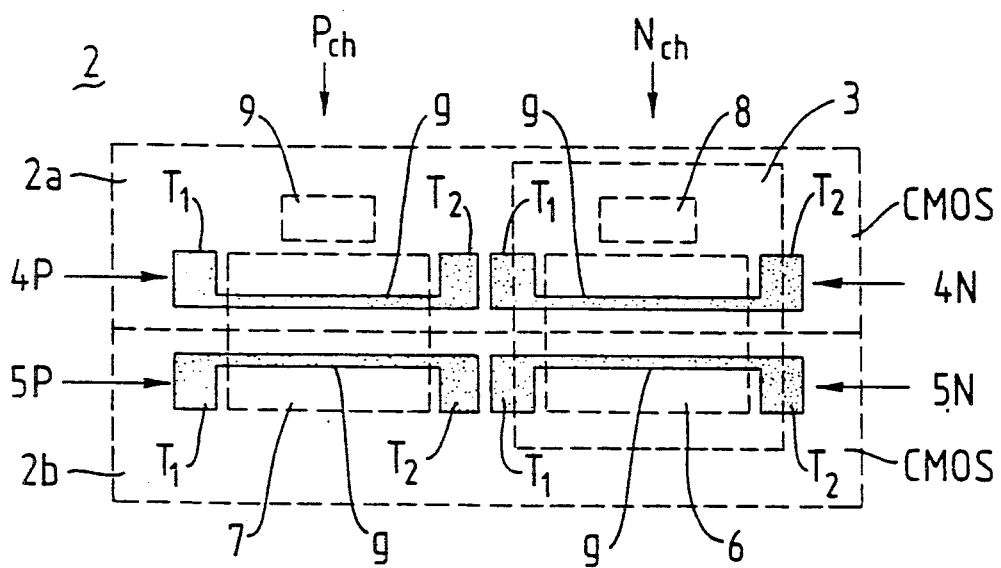
FIG. 18 is an enlarged plan view of the unit device of FIG. 15.
Figure 19:
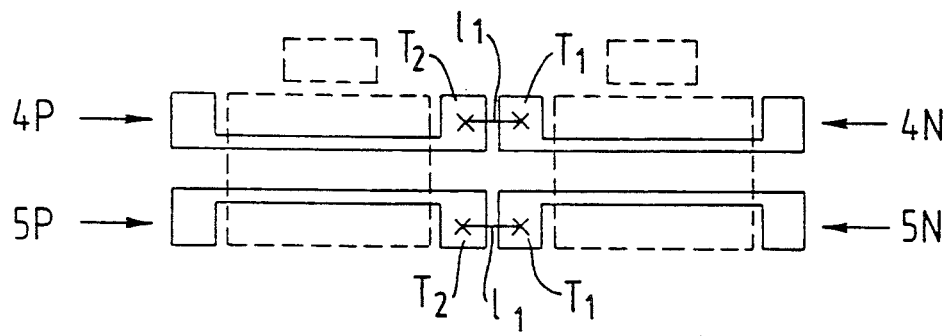
FIG. 19 shows an example of wiring between the gates positioned adjacent to each other in the lateral direction in the unit device of FIG. 15.

The space occupied by the unit device 12 of the present embodiment is four grid spaces long in the X direction and twelve grid spaces wide in the Y direction and so is the same as that of the prior art unit devices of FIG. 18. The unit devices of the present embodiment are characterized by adding the second and third wire connecting locations $t_2$, $t_3$, $t_2'$ and $t_3'$ to the gates 14N and 15N as shown by hatching in FIG. 4 which are located in unused regions of the grid row in which the stoppers 8 and 9 are situated and of the grid row in which the common source or drain regions are situated. Therefore, an increase in the area of the unit devices can be avoided in the present embodiment.

Figure 6:
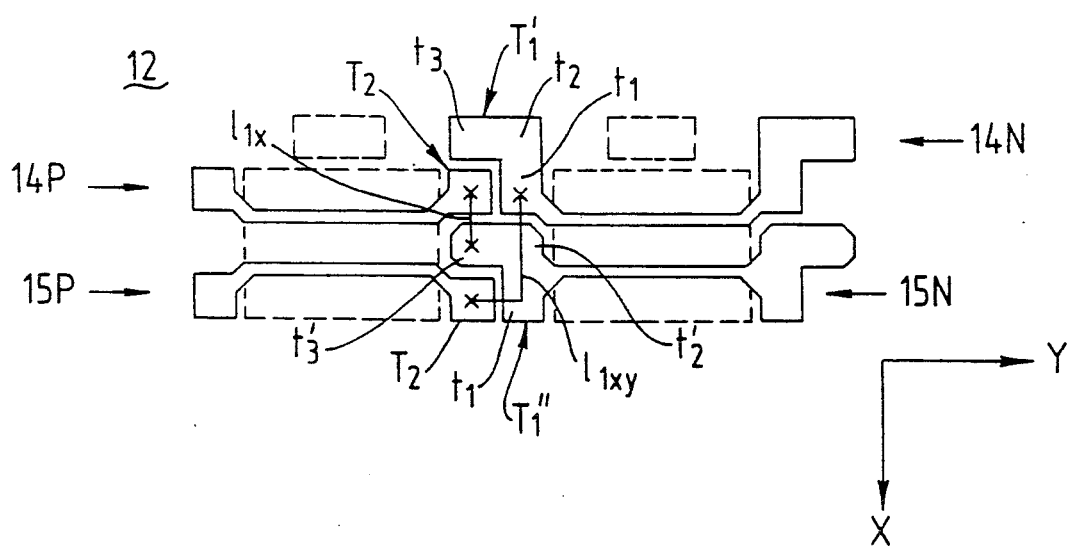
FIG. 6 illustrates diagonal wiring between adjacent gates in the gate-separated type unit device in FIG. 2.

Next, diagonal wiring of the gates in the unit device 12 can be carried out as shown in FIG. 6, wherein the terminal portion $T_2$ of the gate 14P is connected to the terminal portion $T_1''$ and the portion $T_2$ of the gate 15P is connected to the portion $T_1'$ of the gate 14N. In the illustrated diagonal wiring, the terminal portion $T_2$ is connected to the adjacent terminal portion $T_1''$ of the gate 15N at its third wire connecting location $t_3'$ by means of an aluminum wire $l_{1X}$ of the first layer arranged along the longitudinal grid line (X grid-direction), whereas the terminal portion $T_2$ of the gate 15P is connected to the terminal portion $T_1'$ of the gate 14N at its first wire connecting location $t_1$ by means of an aluminum wire $l_{1XY}$ of the first layer arranged so that it passes over the first and second wire connecting locations $t_1$ and $t_2'$ of the terminal portion $T_1'$ in that order.

In the present embodiment, a space of three grid square lengths in the X direction by two grid square widths in the Y direction is defined by the terminal portions $T_2$ of the respective gates 14P and 15P, the terminal portion $T_1''$ of the gate 15N, and the first wire connecting locations $t_1$ of the terminal portions $T_1''$ and $T_1'$ of the respective gates 15N and 14N, in which space the diagonal wiring among the gates can be performed by the aluminum wires of the first layer without utilizing aluminum wires in a second layer deposited on the first aluminum layer. The benefits obtained from using only the first aluminum layer are that wire prohibited tracks occurring due to the use of a second aluminum layer can be avoided, which contributes to enhancement of the outer wiring feasibility.

Figure 20:
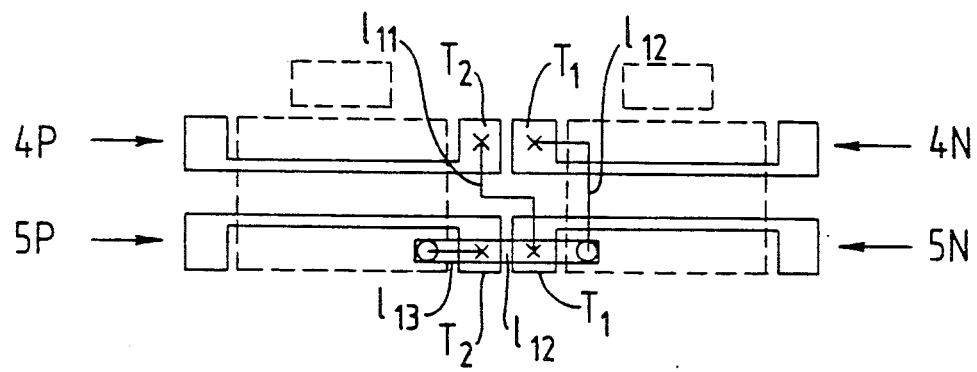
FIG. 20 shows an example of wiring between the gates diagonally positioned in the unit device of FIG. 15.

As shown in FIG. 20, according to the prior art wiring, it is inevitable to arrange the aluminum wires $l_{13}$ and $l_2$ in the first and second layers one on the other in the opposite directions and to arrange wires such as the aluminum wire $l_{12}$ to extend across the gate electrodes g and so the Wires cannot be arranged within the space of three grid square lengths by two grid square widths. In contrast, according to the present embodiment, since aluminum wires in a second layer do not need to be utilized and wires do not go over the gate electrodes g, the wiring length can be reduced. Therefore, the capacitance and resistance caused by wiring can be reduced at the same time, the inner wiring feasibility can be enhanced, and the time delays caused by the wiring can be reduced.

Figure 7:
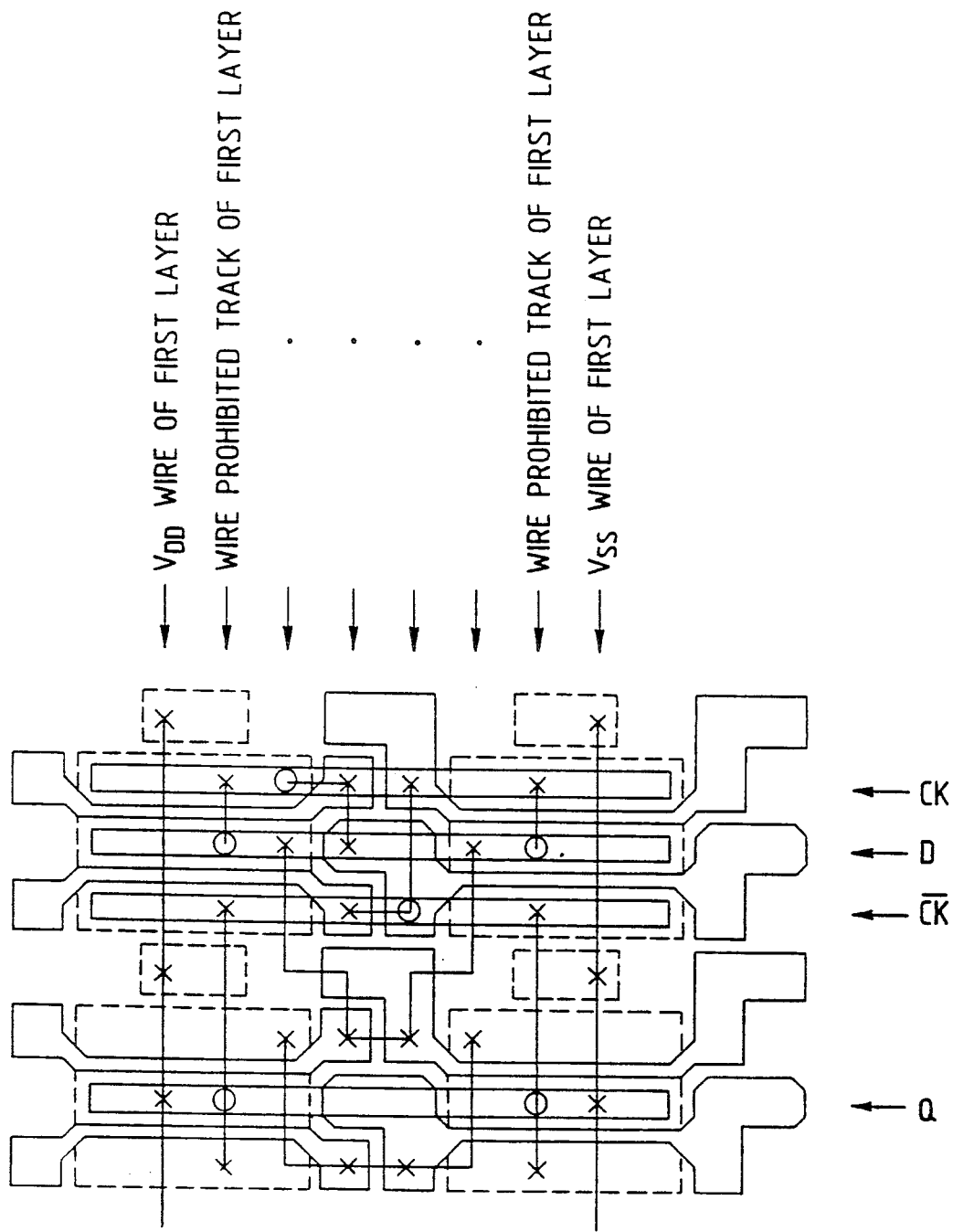
FIG. 7 is a plan view of a D flip-flop constituted by two unit devices according to the first embodiment of the present invention.
Figure 22:
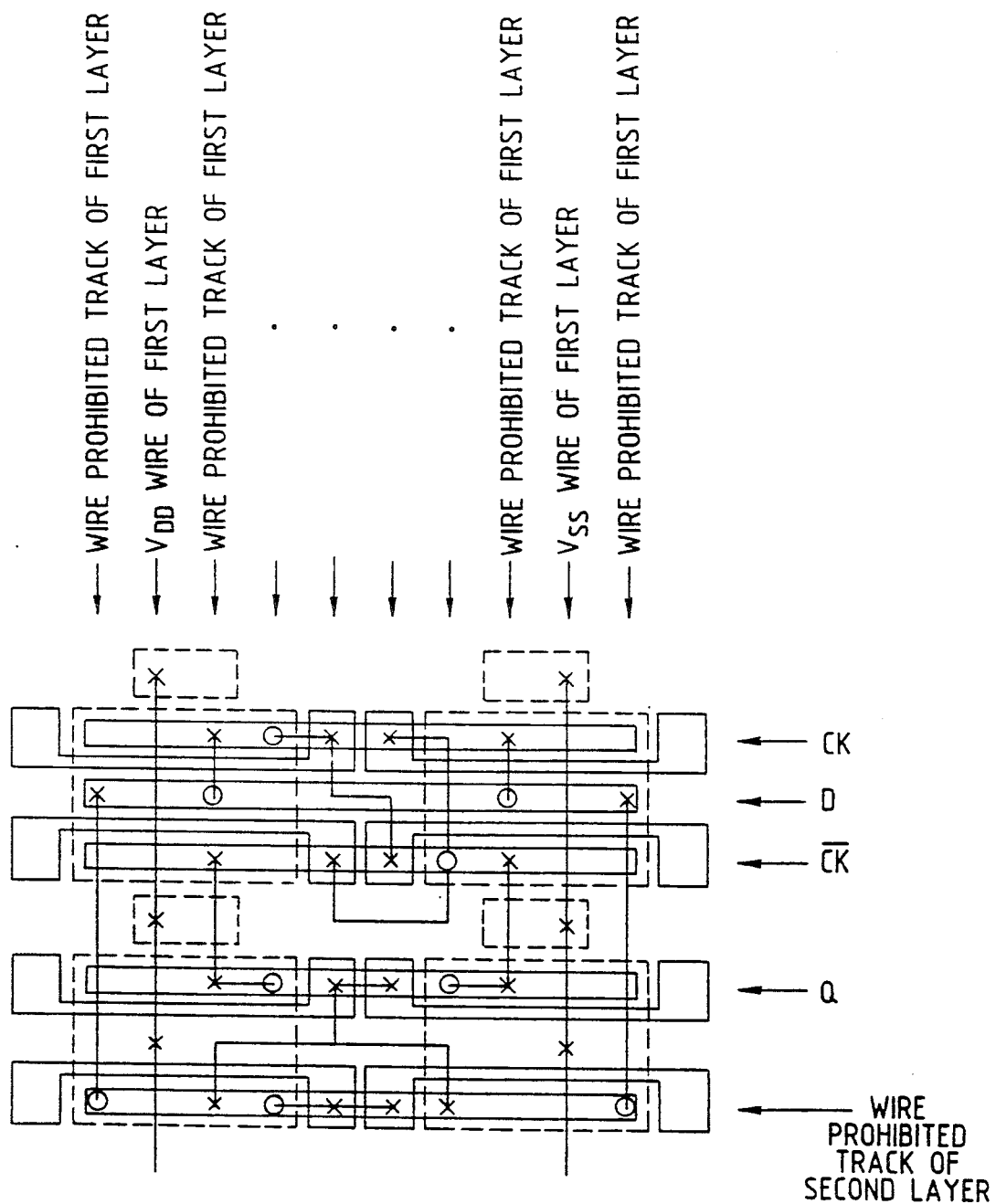
FIG. 22 shows an example of wiring between two unit devices of FIG. 15 to compose a D flip-flop.

FIG. 7 illustrates a D flip-flop composed of two unit semiconductor devices of the present embodiment, the flip-flop being electrically the same as that of FIG. 22. It should be noted in FIG. 7 that the wiring length is extremely reduced and that no prohibited tracks of the second wires occur. The terminal portions $T_1'$, $T_2'$, $T_1''$ and $T_2''$ of the respective gate 14N and 15N are all provided with the second and third wire connecting locations. Alternatively, as is apparent from the wiring illustrated in FIG. 6, unit devices without enlarged terminal portions $T_1'$, $T_2'$ and $T_2''$ of the respective gates 14N and 15N can be used to thereby enhance the inner and outer wiring feasibilities in comparison with those of the prior art unit devices.

Figure 8:
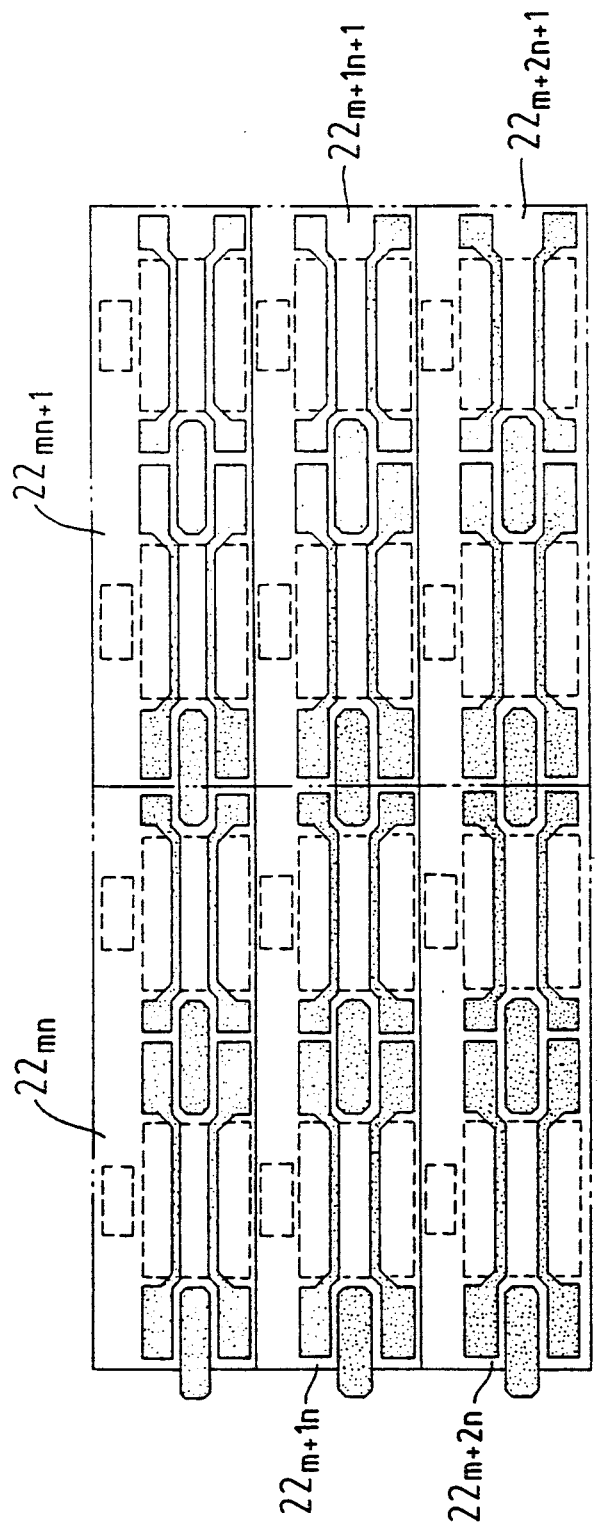
FIG. 8 is a diagram illustrating an array of gate-separated type unit devices according to a second embodiment of the present invention.
Figure 9:
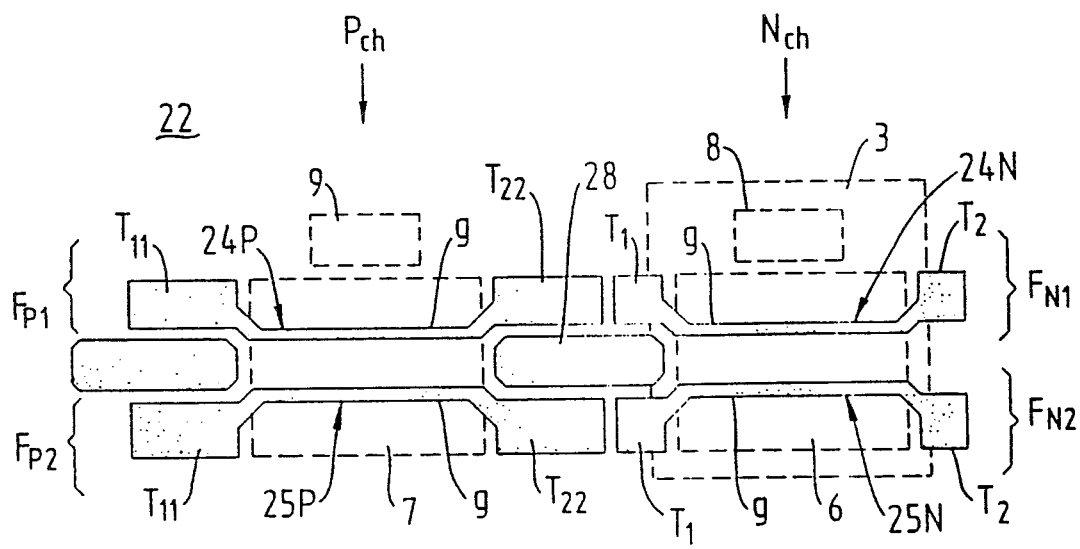
FIG. 9 is a plan view of the unit device in an enlarged scale of FIG. 8.
Figure 10:
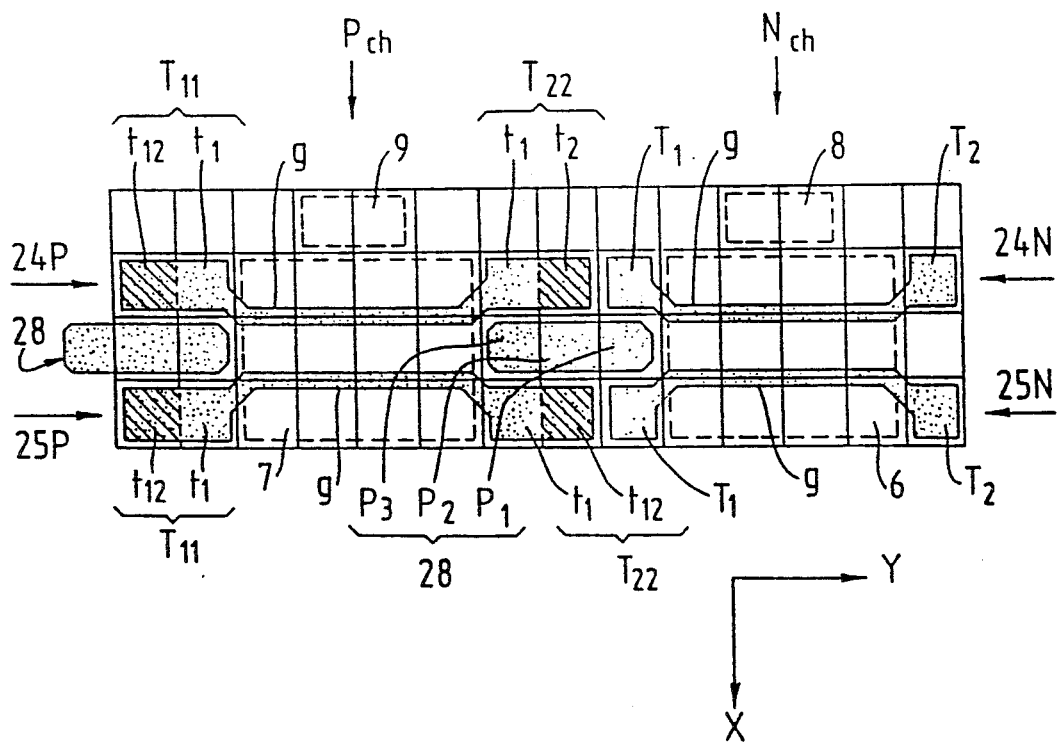
FIG. 10 is a layout of the gate-separated type unit device of FIG. 9.

FIGS. 8 to 10 illustrate another embodiment of the present invention, in which elements corresponding to the above-mentioned embodiment are designated by the same reference numerals. As shown in FIG. 8, a plurality of unit semiconductor devices 22 are arranged to form a matrix. One of the unit semiconductor devices 22 is illustrated in FIG. 9. The unit semiconductor device 22 comprises a pair of parallel N-channel MOSFETs ($F_{N1}$, $F_{N2}$) and a pair of parallel P-channel MOSFETs ($F_{P1}$, $F_{P2}$) The N-channel MOSFETs have polysilicon gates 24N and 25N, respectively, which are of a substantially flat U-shape and are disposed in mirror symmetry with each other. As shown in FIG. 10, each of the polysilicon gates 24N and 25N comprises a narrow gate electrode portion g of about four grid square lengths and terminal portions $T_1$ and $T_2$ of one grid square area integrally connected to respective ends of gate electrode g. The terminal portions $T_1$ and $T_2$ have an area sufficient for wiring via a signal wire connecting location, that is, a single contact hole. The gate electrodes g are spaced apart by one grid width distance, below which channel regions of four grid square lengths are formed. Among these, the channel region between the parallel gate electrodes g, g in the high impurity density N-type diffused region 6 is a common drain or source region for the N-channel MOSFETs.

Polysilicon gates 24P and 25P of the P-channel MOSFETs are substantially of a flat U-shape and disposed at locations laterally offset by a predetermined distance from gates 24N and 25N. The gates 24P and 25P are designed to have a shape different from the gates 24N and 25N. The gate 24P comprises a portion having the same shape as that of the gate 24N and a portion denoted by hatching in FIG. 10. That is, the gate 24P comprises a long, narrow gate electrode portion g of substantially four grid square lengths and rectangular terminal portions $T_{11}$ and $T_{22}$ of two grid squares in area. The terminal portion $T_{22}$ is located adjacent to the gate 24N and is composed of a first wire connecting location $t_1$ one grid square in area corresponding to the terminal portion $T_2$ of the gate 24N and a second wire connecting location $t_{12}$ one grid square in area extending outwardly in the channel width direction from the first connecting location $t_1$. The other terminal portion $T_{11}$ is composed of a first wire connecting location $t_1$ one grid square in area corresponding to the terminal portion $T_1$ of the gate 24N and a second wire connecting location $t_{12}$ one grid square in area extending outwardly in the channel width direction from the first wire connecting location $t_1$.

Likewise, the gate 25P adjacent to the gate 25N has a terminal portion $T_{22}$ which comprises a first wire connecting location $t_1$ one grid square in area corresponding to the terminal portion $T_2$ of the gate 25N and a second wire connecting location $t_{12}$ one grid square in area extending outwardly in the channel width direction from the first wire connecting location $t_1$. The terminal portion $T_{11}$ located opposite to the portion $T_{22}$ comprises a first wire connecting location $t_1$ one grid square in area and a second wire connecting location $t_{12}$ one grid square in area extending outwardly in the channel width direction from the first wire connecting location $t_1$. By adding the second wire connecting locations $t_{12}$, the gates 24P and 25P are eight grid squares long in the channel width direction.

A region is defined by the surrounding terminal portions $T_1$ and $T_{22}$ of the gates 24N, 25N, 24P and 25P, and an isolated wire junction area 28 is arranged within this region. The wire junction area, or portion, 28 is formed at the same time the gates are formed and so is formed by polysilicon doped with impurities. The wire junction area 28 has a first wire-junction location P1 between the two terminal portions $T_1$, a second wire-junction location P2 between the two second wire connecting locations $t_{12}$, and a third wire-junction location P3 between the two first wire connecting locations $t_1$.

Figure 11:
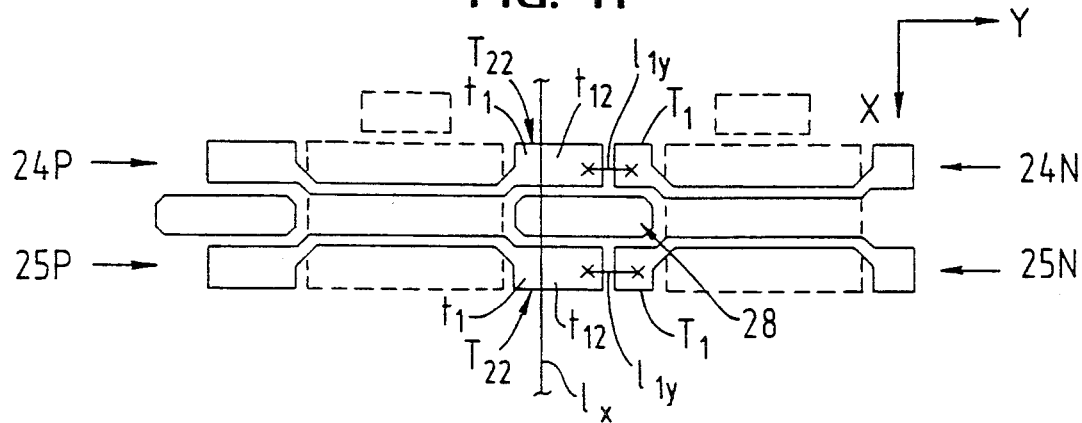
FIG. 11 illustrates one mode of wiring between gates positioned adjacent to each other in the lateral direction in the gate-separated type unit device of FIG. 9.
Figure 12:
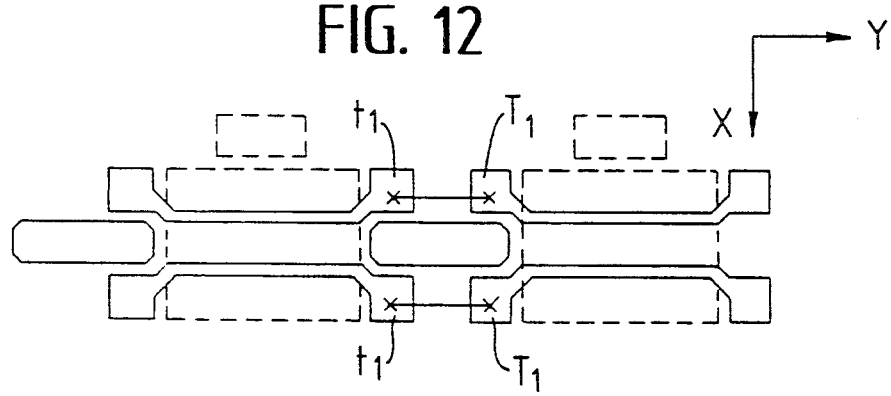
FIG. 12 illustrates another mode of wiring between gates positioned adjacent to each other in the lateral direction in the gate-separated type unit device in FIG. 9, in which the gates are not provided with second wire connecting portions.

In the unit semiconductor device having the above structure, the gates 24P and 25P can be connected to the adjacent gates 24N and 25N as shown in FIG. 11, wherein the second wire connecting locations $t_{12}$ of the respective gates 24P and 25P are connected via contact holes designated by 'X' to the terminal portions $T_1$ of the gates 24N and 25N by means of aluminum wires $l_{1Y}$ of the first layer arranged laterally (along the Y-grid direction). The lateral wiring among the gates can be performed by the shortest wires, that is, one-grid long wires. In addition, the first wire connecting locations $t_1$ remain unused and so an aluminum wire $l_X$ can be arranged in the longitudinal direction (X-grid direction) passing therethrough. In contrast, if the terminal portions $T_1$ and $T_1$ of the gates 24P and 25P were not provided with the second wire connecting locations $t_{12}$ one grid square in area, as shown in FIG. 12, there is no space to pass an aluminum wire in the X direction between the adjacent terminal portions, which means that a wire prohibited track three grid squares in length occurs between the adjacent terminal portions in the first aluminum layer.

Figure 13:
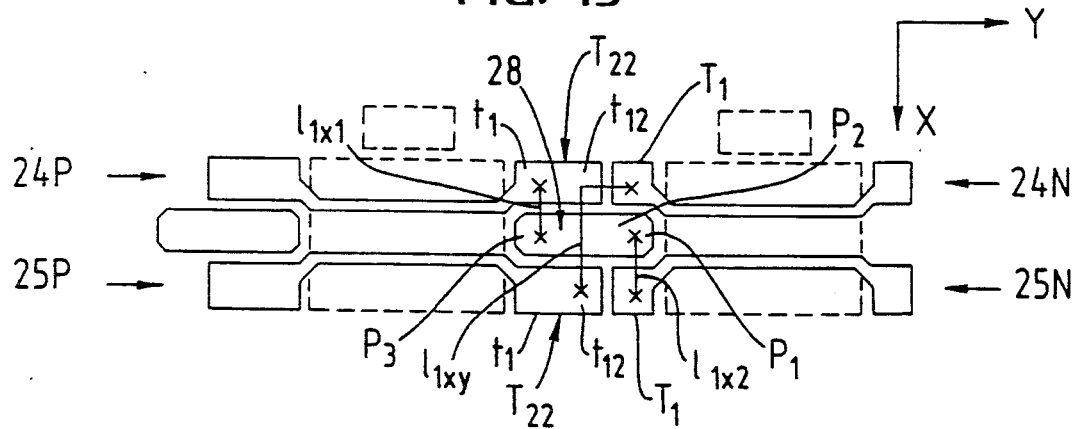
FIG. 13 illustrates one mode of wiring between diagonally positioned gates in the gate-separated type unit device of FIG. 9.

Next, in the unit semiconductor device 22 of the present embodiment, diagonal wiring among the gates can be established as shown in FIG. 13, wherein the terminal portion $T_{22}$ of the gate 24P is connected to the terminal portion $T_1$ of the gate 24N and the terminal portion $T_{22}$ of the gate 25P to the terminal portion $T_1$ of the gate 24N. As shown in FIG. 13, the terminal portion $T_{22}$ of the gate 24P is connected at its first wire connecting location $t_1$ to the adjacent third wire-junction location P3 of the wire-junction area 28 via an aluminum wire $l_{1X1}$ arranged in the X direction, the wire-junction area 28 is connected at its first wire-junction location P1 to the terminal portion $T_1$ of the gate 25N via an aluminum wire $l_{1X2}$ arranged in the X direction, and the terminal portion $T_{22}$ of the gate 25P is connected at its second wire connecting location $t_{12}$ to the terminal portion $T_1$ of the gate 24N via an aluminum wire $l_{1XY}$ arranged to pass over the second wire-junction location P2 of the area 28 and the second wire connecting location $t_{12}$ of the terminal portion $T_{22}$ in this order. The above aluminum wires are all of the first layer.

The above diagonal wiring among the gates can be performed within a space three grid squares in length in the X direction by three grid squares in width in the Y direction by only the first aluminum layer. In comparison with the unit semiconductor device 12 of FIG. 2, although the unit semiconductor device 22 is longer in the Y direction by one grid square and has an increased area by that amount, it has the benefit that the passage for the aluminum wires $l_X$ is assured between the laterally adjacent terminal portions. Thus, according to the present embodiment, the first layer of wires can easily be distributed to thereby obtain more improved outer wiring feasibility.

Figure 14:
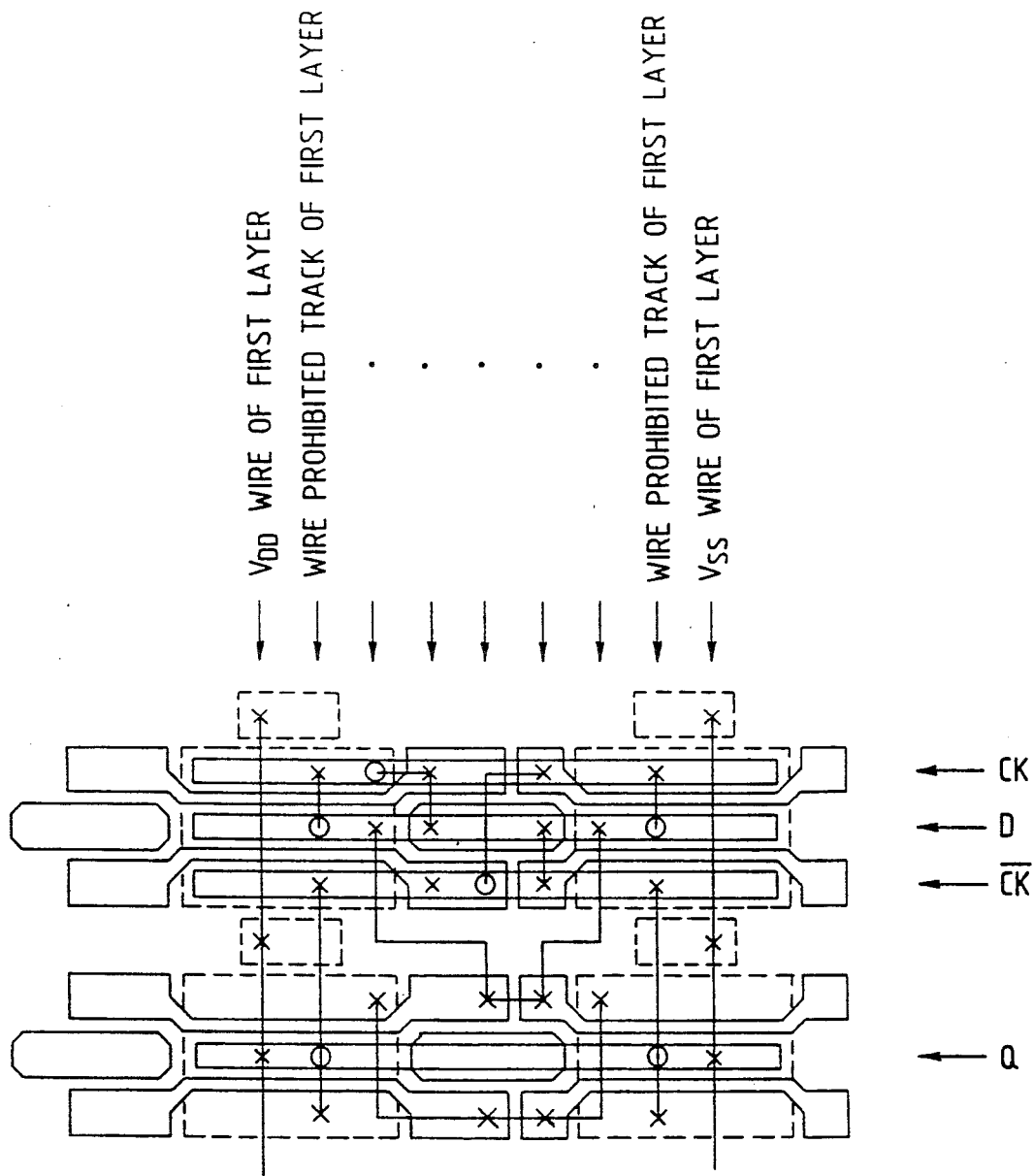
FIG. 14 is a plan view of a D flip-flop constituted by two unit devices according to the second embodiment of the present invention.
Figure 15:
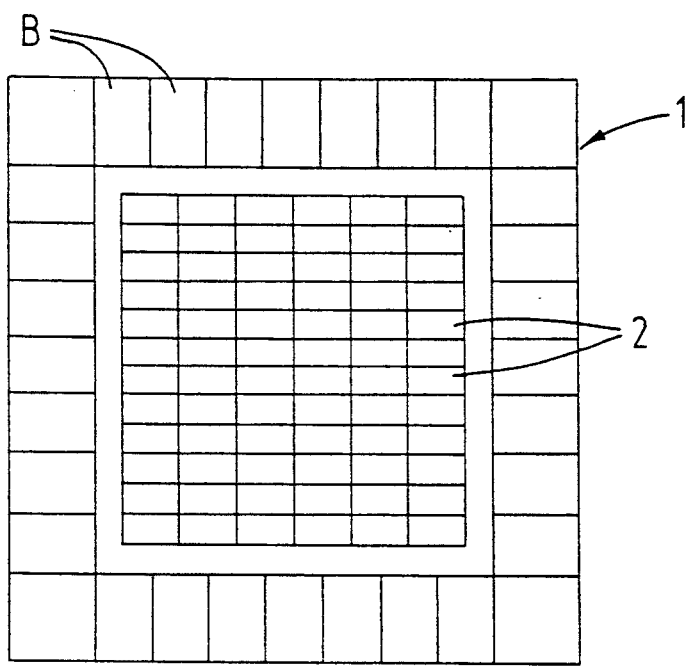
FIG. 15 is a schematic plan view showing an inner structure of a semiconductor chip of a conventional channelless-type gate array.
Figure 16:
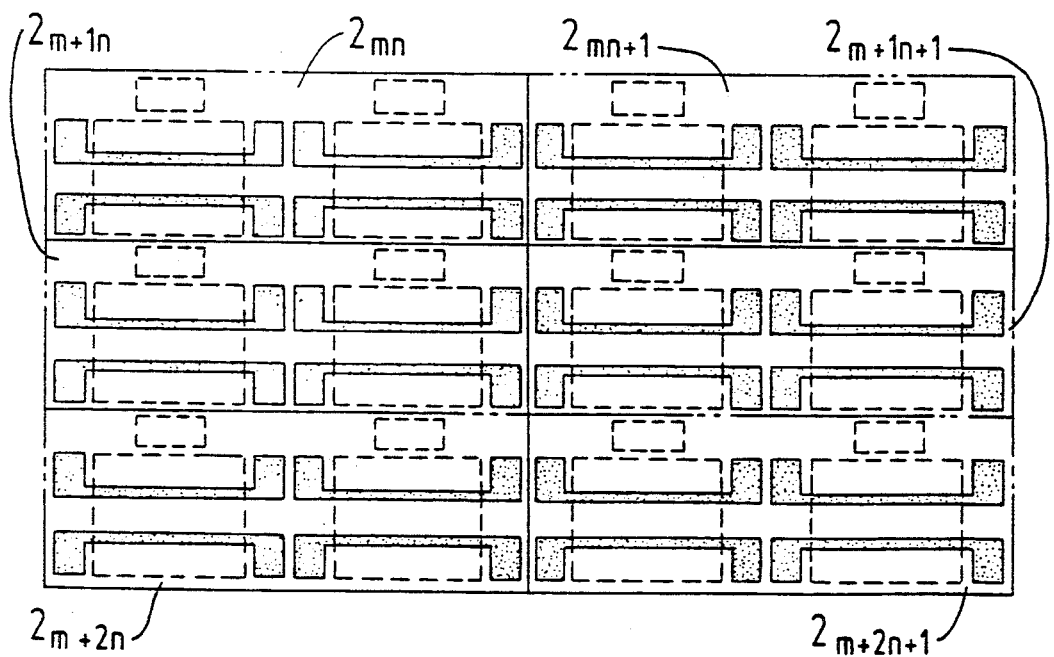
FIG. 16 illustrates an array of gate-separated type unit device of FIG. 15.
Figure 17:
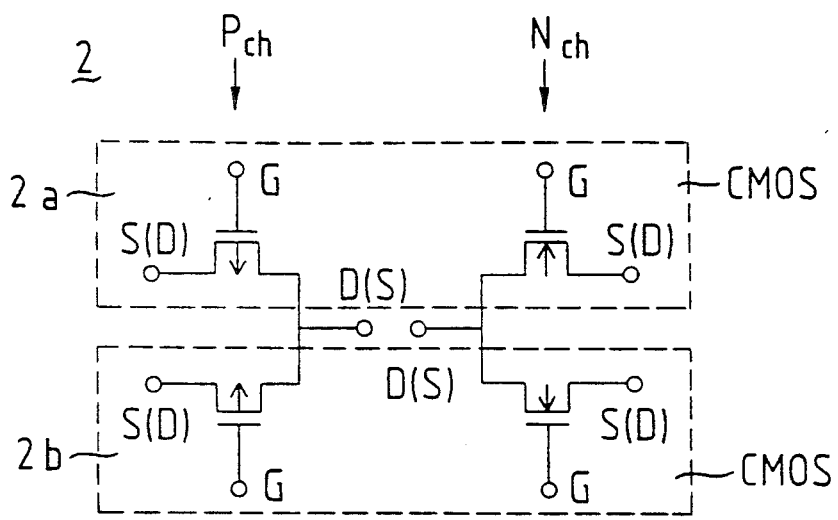
FIG. 17 is a circuit diagram of the unit device of FIG. 15.
Figure 21:
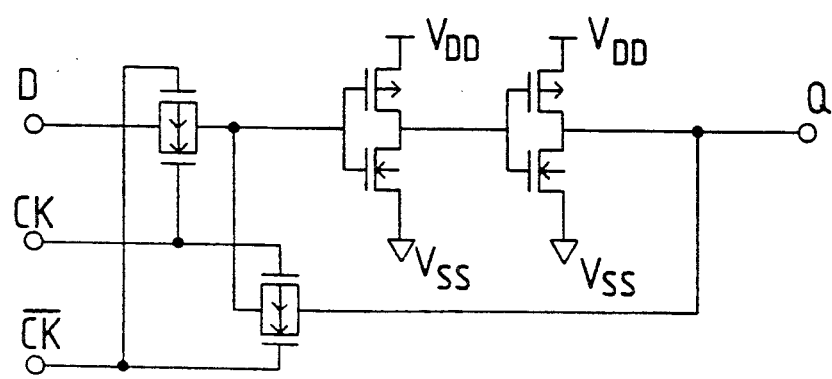
FIG. 21 is a circuit diagram of a D flip-flop composed by MOSFETs.

FIG. 14 illustrates a D flip-flop wired to have the circuit configuration of FIG. 21 which is comprised by the two unit semiconductor devices 22. As can be seen from FIG. 14, the layout of the flip-flop is simplified so that the total wiring length is greatly reduced and no prohibited tracks occur in the second layer.

The gates 24P and 25P of the unit device 22 are provided with the terminal portions $T_{22}$ having the second wire connecting locations $t_{12}$, respectively. Alternatively, only one of the gates 24P and 25P may be provided with the terminal portion $T_{22}$ having the second wire connecting location $t_{12}$ in order to perform the diagonal wiring among the gates by using only the first layered wires, which is apparent from FIG. 13.

This application relates to subject matter disclosed in Japanese Patent Applications Nos. 99430/89, filed Apr. 19, 1989, and 125839/89, filed May 19, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device assembly comprising a plurality of unit semiconductor devices, wherein each said unit semiconductor device comprise at least a first insulated-gate type field-effect transistor of a first conductivity type and having a gate electrode, and at least a second insulated-gate type field-effect transistor of a second conductivity type which is disposed adjacent to, and in the same plane as, said first transistor and which has a gate electrode separated from said gate electrode of said first transistor, said gate electrode of each said transistor has at least a gate terminal portion, said gate terminal portion of said gate electrode of said first transistor is disposed adjacent to said gate terminal portion of said gate electrode of said second transistor, and said gate terminal portion of said first field-effect transistor is configured to have at least a first wire connecting location and a second wire connecting location, wherein said transistors of said unit semiconductor devices are connected together by wires to thereby constitute a circuit.

2. The semiconductor device assembly as set forth in claim 1 wherein said gate terminal portion of each of said first and second transistors is connected to its associated gate electrode and said gate terminal portions are formed in the same layer as said gate electrodes.

3. The semiconductor device assembly as set forth in claim 2 wherein said first and second transistors have channel regions which are all oriented in a first direction.

4. The semiconductor device assembly as set forth in claim 3 wherein each of said first and second transistors has source and drain regions and said gate terminal portions of said gate electrodes of said first and second transistors are formed in regions spaced from said source and drain regions of said transistors and are wider than said gate electrodes.

5. The semiconductor device assembly as set forth in claim 4 wherein said assembly is physically laid out on a surface which is defined by a two dimensional rectangular grid array, said array being composed of a plurality of parallel rows and a plurality of parallel columns, said parallel rows being perpendicular to said parallel columns and each said row and each said column defining a respective route for connecting wires, and said first wire connecting location of said first transistor and said gate terminal portion of said second transistor are arranged in first and second parallel columns, respectively.

6. The semiconductor device assembly as set forth in claim 5 wherein said first and second wire connecting locations of said first transistor are arranged in first and second parallel rows, respectively, of said array.

7. The semiconductor device assembly as set for the in claim 6 wherein said gate terminal portion of said first transistor has a third wire connecting location, said first and second wire connecting locations of said first transistor are arranged in one column of said array, and said second and third wire connecting locations are arranged in one row of said array.

8. The semiconductor device assembly as set forth in claim 5 wherein said first and second wire connecting locations of said first transistor are arranged in one row of said array.

9. The semiconductor device assembly as set forth in claim 8 wherein said unit semiconductor device comprises a third insulated-gate type field-effect transistor of the first conductivity type which is provided with a source or drain region common to the source or drain region of said first transistor and a gate electrode arranged parallel to the gate electrode of said first transistor, and a fourth insulated-gate type field-effect transistor of the second conductivity type which is provided with a source or drain region common to the source or drain region of said second transistor and a gate electrode arranged parallel to the gate electrode of said second transistor, and wherein said unit semiconductor device further comprises a wire junction portion formed in an area surrounded by said gate electrodes of said first, second, third, and fourth transistors.

10. The semiconductor device assembly as set forth in claim 9 wherein said wire junction portion is formed in the same layer as said gate electrodes.

11. The semiconductor device assembly as set forth in claim 10 wherein said gate terminal portion of said first transistor is substantially rectangular.

12. A semiconductor device assembly comprising a plurality of unit semiconductor devices and a plurality of connecting wires, characterized in that:
   each of said unit semiconductor devices comprises first and second insulated-gate type field-effect transistors of a first conductivity type and third and fourth insulated-gate type field-effect transistors of a second conductivity type, each of said transistors being provided with a respective gate electrode;
   said gate electrode of each said transistor has a gate terminal portion and said gate terminal portions of said gate electrodes of said first and second transistors are disposed adjacent said gate terminal portions of said gate electrodes of said third and fourth transistors; and
   said gate terminal portion of said gate electrode of said first transistor comprises at least a first wire connecting location formed at one end of said gate electrode and a second wire connecting location extending from said first wire connecting location and located between said gate terminal portions of said gate electrodes of said third and fourth transistors, wherein said transistors of said unit semiconductor devices are connected together by said connecting wires to thereby constitute a circuit.

13. A semiconductor device assembly comprising a plurality of unit semiconductor devices and a plurality of connecting wires, characterized in that:
   each of said unit semiconductor devices comprises first and second insulated-gate type field-effect transistors of a first conductivity type and third and fourth insulated-gate type field-effect transistors of a second conductivity type, each of said transistors being provided with a respective gate electrode;
   said gate electrode of each said transistor has a gate terminal portion and said gate terminal portions of said gate electrodes of said first and second transistors are disposed adjacent said gate terminal portions of said gate electrodes of said third and fourth transistors;
   each of said gate terminal portions of said gate electrodes of said first and second transistors comprises at least first second wire connecting locations; and
   each of said unit semiconductor devices further comprises a wire junction portion formed in an area surrounded by said gate terminal portions of said gate electrodes of said first, second, third and fourth transistors, wherein said transistors of said unit semiconductor devices are connected together by said connecting wires to thereby constitute a circuit.

14. A gate array which is composed of a plurality of unit semiconductor devices, wherein each said unit semiconductor device comprises a first insulated-gate type field-effect transistor having a gate electrode and a second insulated-gate type field-effect transistor which is disposed adjacent to said first transistor and which has a gate electrode separated from said gate electrode of said first transistor, said gate electrode of each said transistor has at least a gate terminal portion, said gate terminal portion of said gate electrode of said first transistor is disposed adjacent to said gate terminal portion of said gate electrode of said second transistor, and said gate terminal portion of said first field-effect transistor is configured to have at lease a first wire connecting location and a second wire connecting location.

* * * * *